United States Patent [19]
Ishikawa et al.

[11] Patent Number: 5,507,880
[45] Date of Patent: Apr. 16, 1996

[54] AMORPHOUS SOLAR MODULE HAVING IMPROVED PASSIVATION

[75] Inventors: Atsuo Ishikawa; Toshihito Endo, both of Akashi; Hideo Yamagishi; Yoshihisa Tawada, both of Kobe, all of Japan

[73] Assignee: Kanegafuchi Kagaku Kogyo Kabushiki Kaisha, Osaka, Japan

[21] Appl. No.: 322,524

[22] Filed: Oct. 14, 1994

Related U.S. Application Data

[63] Continuation-in-part of Ser. No. 71,252, Jun. 4, 1993, abandoned.

[30] Foreign Application Priority Data

| Jun. 8, 1992 | [JP] | Japan | 4-174785 |
| May 12, 1993 | [JP] | Japan | 5-135285 |

[51] Int. Cl.[6] .................................. H01L 31/048
[52] U.S. Cl. .................. 136/251; 136/259; 257/433; 257/788; 257/790
[58] Field of Search ................. 136/251, 259; 257/433, 788–790

[56] References Cited

U.S. PATENT DOCUMENTS

| 4,686,321 | 8/1987 | Kishi | 136/244 |
| 4,705,911 | 11/1987 | Nakano et al. | 136/251 |
| 4,816,324 | 3/1989 | Berman | 428/216 |
| 4,953,577 | 9/1990 | Marshall | 136/251 |
| 5,059,254 | 10/1991 | Yaba et al. | 136/251 |
| 5,354,385 | 10/1994 | Hashimoto et al. | 136/259 |

FOREIGN PATENT DOCUMENTS

| 57-63866 | 4/1982 | Japan | 136/251 |
| 59-198776 | 11/1984 | Japan | 136/251 |

OTHER PUBLICATIONS

D. C. Carmichael et al, *Conference Record, 12th IEEE Photovoltaic Specialists Conf.* (1976), pp. 317–331.

M. Johnson, *Solar Cells*, 28, 121–128 (1990).

*Primary Examiner*—Aaron Weisstuch
*Attorney, Agent, or Firm*—Armstrong, Westerman, Hattori, McLeland & Naughton

[57] ABSTRACT

A solar module made by the sequential stacking of a conducting metal oxide layer, an amorphous semiconductor layer, a back metal electrode, and a passivating resin layer on a transparent substrate, in which the passivating resin layer includes a water vapor barrier layer having a permeability to water vapor of not more than 1 g/m² day measured at a thickness of 100 μm, with the water vapor barrier layer being a polymer having a backbone consisting essentially of carbon and hydrogen. This barrier layer prevents the oxidation of the back metal electrode by water vapor, so that the stability of the module is improved in outdoor use.

7 Claims, 3 Drawing Sheets

AMORPHOUS SOLAR MODULE HAVING IMPROVED PASSIVATION

This application is a continuation-in-part of application Ser. No. 08/071,252, filed Jun. 4, 1993, now abandoned.

BACKGROUND OF THE INVENTION

The present invention relates to a solar module, and in particular to a photovoltaic device using an amorphous semiconductor, that is, an amorphous solar module. More particularly, it relates to a solar module for outdoor use having improved passivation.

In contrast to crystalline solar cells, solar cells made from amorphous semiconductors, such as amorphous silicon, are characterized as being easily fabricated on various kinds of substrates, such as glass, metal, resin, and so forth, at relatively low temperatures. Accordingly, fairly small-scale solar modules, where a solar module is defined as, for example, a structure having a passivating layer over connected solar cells, are typically fabricated by forming a solar cell element comprising layers of conductive metal oxide, amorphous semiconductor, and metal electrode on a glass substrate, and then passivating the structure by vacuum lamination of a resin sheet having an undercoated adhesive layer. Since a robust structure is required for practical use, it is necessary to strengthen this type of solar module, and as a result, larger-sized modules have usually been made by constructing an array of solar submodules on tempered or laminated glass, where each submodule comprises a conductive metal oxide layer, an amorphous semiconductor layer and a metal electrode layer fabricated on a glass substrate. After making the electrical contacts, the module is passivated by vacuum lamination of a resin sheet which is undercoated with an adhesive layer.

A major problem in fabricating this type of large-scale solar module is that, as described above, the manufacturing process is complex, consisting of several steps, such as arranging the solar submodules on the tempered glass, making the electrical connections, vacuum laminating and so forth, in addition to the submodule fabrication steps. Further, because expensive vacuum equipment is required, there are other problems of increased manufacturing cost and reduced reliability.

The present invention has been realized in consideration of these kinds of problems inherent in the previous technology, and accordingly, the object of this invention is to provide a solar module which can be effectively passivated by using simple steps and convenient techniques.

SUMMARY OF THE INVENTION

In accomplishing the foregoing and related objects, the present invention provides a solar module comprising:

(a) a conductive metal oxide layer;

(b) an amorphous semiconductor layer;

(c) a back metal electrode; and (d) a passivating resin layer, wherein the conductive metal oxide layer, the amorphous semiconductor layer, the back metal electrode, and the passivating resin layer are formed on a transparent substrate in this order, and the passivating resin layer comprises a hydrocarbon-based water vapor resistant barrier layer having a permeability to water vapor of not more than 1 g/m$^2$ day at a thickness of 100 µm (measured according to ASTM E 96-53 T), with the water vapor barrier layer comprising a hydrocarbon-based polymer i.e. a polymer having a backbone consisting essentially of carbon and hydrogen. The hydrocarbon-based polymer typically has a terminal functional group which permits thermal curing by addition polymerization or condensation polymerization. Such functional groups may contain at least one of nitrogen, silicon, and oxygen in addition to carbon and hydrogen. For example, polyisobutylene has certain functional groups containing silicon as illustrated in Example 1, below. On the other hand, the hydrocarbon-based polymer does not include a fluorinated polyurethane.

In the solar module of the present invention, it is preferable that at least part of the passivating resin layer is formed by coating, and also that at least part of the passivating resin layer is thermally cured.

Furthermore, in the solar module of the present invention, the water vapor barrier layer is preferably a member selected from the group consisting of polyisobutylene, polyisoprene, modified polyisoprene, polybutene, polybutadiene, and modified polybutadiene. Polyisobutylene is most preferred. By "modified" it is meant hydrogen addition to unsaturated polymer.

In addition, in the solar module of the present invention, it is preferable that the passivating resin layer also contains an oxygen barrier layer which has a permeability to oxygen of not more than 0.1 cc mm/m$^2$ day atm (measured according to ASTM D 1434-58), such as a copolymer of ethylene and vinyl alcohol.

In the solar module of the present invention, degradation of the performance of the back metal electrode by water vapor is prevented because of the presence of the water vapor barrier layer in the passivating resin layer. In a preferred embodiment of the present invention, performance degradation resulting from oxidation of the back metal electrode by oxygen is prevented because the passivating resin layer also contains an oxygen barrier layer.

In another preferred embodiment of the present invention, a consequence of forming the passivating resin layer by coating is that the manufacturing steps and apparatus can be made simple and facile.

BRIEF DESCRIPTION OF THE DRAWINGS

These and other aspects of the present invention will become better understood with regard to the following description, appended claims, and accompanying drawings in which:

DETAILED DESCRIPTION OF THE PREFERRED EMBODIMENTS

Figure 1:
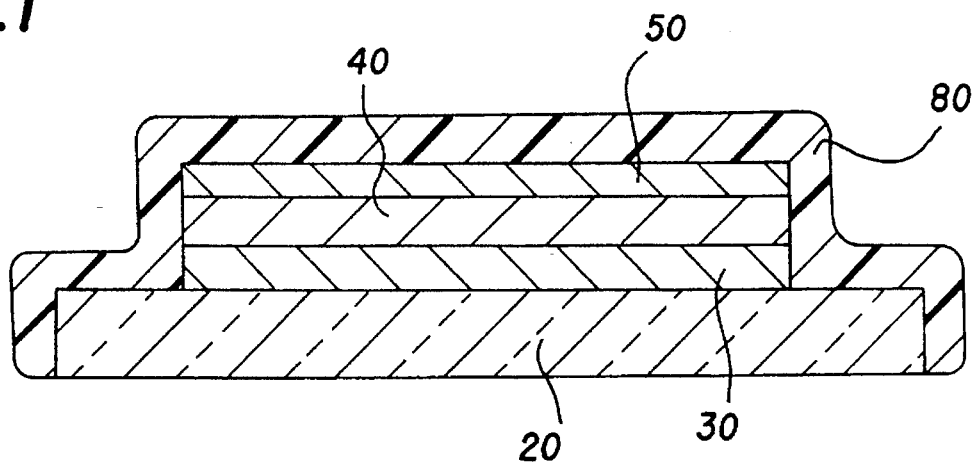
FIG. 1 is a schematic illustration of one example of the solar module of the present invention.

FIG. 1 is a schematic illustration of a solar module in accordance with the present invention. The module is made by the sequential stacking, on a transparent substrate 20, of layers in the order of a transparent conductive film 30, a semiconductor layer 40, and a back metal electrode 50, followed by passivation of the structure with a passivating resin layer 80. The active area of this solar module is not less than 0.05 m², and preferably not less than 0.1 m². Since vacuum lamination techniques become increasingly more difficult to apply as the size of the solar module increases, it becomes increasingly more advantageous to employ a polyisobutylene resin for the passivating layer, particularly with active areas greater than about 0.1 m².

For the transparent substrate 20, various materials such as plastic sheet or glass substrates can be used. In the case where the active area is relatively large, and in particular where it is not less than 0.5 m², tempered or laminated glass are preferably used in view of their resilience.

The transparent conductive film 30, can be $SnO_2$, indium tin oxide, indium oxide and the like, as used in previous solar modules.

The semiconductor layer 40 can be, for example, an amorphous semiconductor, as in previous solar modules. In the present invention, an amorphous semiconductor represents a semiconductor comprising only an amorphous semiconductor and a semiconductor comprising an amorphous semiconductor containing crystallites. a-Si:H; a-Si:H containing C, Ge, Sn or F; or μcSiH(microcrystalline) and the like are enumerated as specific examples of an amorphous semiconductor.

The back metal electrode 50 can be, for example, aluminum, as in previous solar modules.

Figure 8:
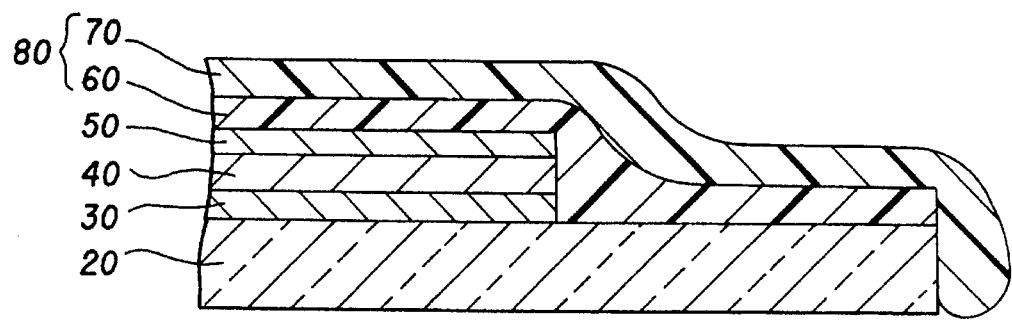
FIG. 8 is a schematic illustration showing the edge structure of an example of the solar module of the present invention.

Referring to FIG. 8, for the oxygen barrier layer 60, materials having a permeability to oxygen of not more than 0.1 cc mm/m² 24 hr atm can be used. There are many examples of this kind of material, such as polyvinylidene chloride; however, a resin made of a copolymer of ethylene and vinyl alcohol is especially preferred. This oxygen barrier layer is included in order to prevent corrosion, since oxygen acts to accelerate the corrosion of the back metal electrode 50 at high temperatures. The film thickness is usually not less than 1 μm, and is preferably about 20–40 μm.

Again referring to FIG. 8, for the hydrocarbon-based water vapor barrier layer 70, materials having a permeability to water vapor of not more than 1 g/m² 24 hr at 100 μm film thickness can be used, such as stretched polypropylene. However, from the viewpoint of insulating property and strength, a polyisobutylene resin having rubber-like elasticity is especially preferred. This kind of polyisobutylene resin is typically formed by the reaction of an isobutylene polymer, having at least one functional group (X) in a molecule, with a curing agent having at least two functional groups (Y) in a molecule which can react with the functional group (X). From the viewpoint of retaining the elasticity of the formed resin, the functional group (X) is preferably located at the terminal of the polymer. A preferred example is a product formed by the addition reaction of an isobutylene polymer having a terminal C—C double bond with a compound having not less than two hydrosilyl groups. These examples are shown in Japanese Unexamined Patent Publication (Tokkyo Kokai) No. 3-95266. For example, the curing agent is preferably a polysiloxane compound, such as cyclosiloxane, having at least two hydrosilyl groups. Examples which can be used are compositions of (A) a polyisobutylene oligomer formed by the reaction of a tertiary chloro terminated polyisobutylene with trimethylallylsilane or 1,9-decadiene, and (B) a curing agent which is the reaction product of 1,3,5,7-tetramethylcyclotetrasiloxane with 1,9-decadiene.

The polyisobutylene oligomer to be used in the present invention has a number average molecular weight of usually 500–100,000, and preferably 2,000–20,000. The oligomer is used in a mixture with a plasticizer such as polybutene, the mixture having a viscosity of 1000–20,000 poise, which is convenient for application to solar modules.

Figure 7:
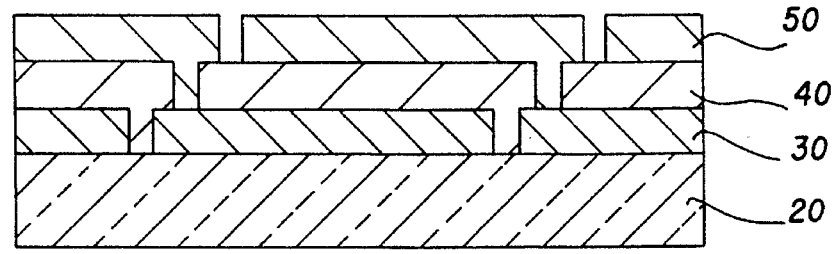

As illustrated in FIG. 7, the hydrocarbon-based water vapor barrier layer 70 is included to prevent degradation of the back metal electrode 50 by water vapor, in a similar manner to the oxygen barrier layer 60. A film thickness of about 0.8–1.0 mm is used.

In this embodiment, the passivating resin layer 80 is formed as a stacked layer, made up of the oxygen barrier layer 60 and the hydrocarbon-based water vapor barrier layer 70; however, it may consist only of a hydrocarbon-based water vapor barrier layer 70. In addition, although not shown in the figure, a barrier layer may be included between the passivating resin layer 80 and the back metal electrode 50; for example, an insulating layer such as silicon oxide. This has the function of preventing the diffusion of atoms of halogen, alkali metal, and alkaline earth metal, contained in the oxygen barrier layer 60 or water vapor barrier layer 70, into the solar cell element.

A detailed explanation of the present invention is given below, based on specific examples.

EXAMPLE 1

Figure 2:
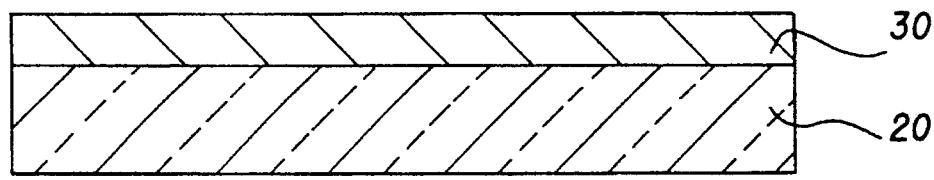
FIGS. 2–7 are a series of schematic drawings illustrating the manufacturing steps of an example of the solar module of the present invention.
Figure 3:
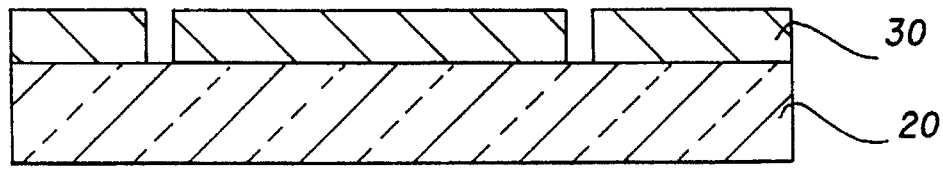

Using the thermal CVD method, an $SnO_2$ layer 30 of approximately 500 nm thickness was fabricated on a 4 mm thick, 500 mm by 600 mm soda glass substrate 20, after which the glass was tempered by heating and rapid cooling, thereby forming the conductive tempered glass substrate illustrated in FIG. 2. The $SnO_2$ layer 30 on the conductive tempered glass substrate was divided into 1-cm wide electrical strips using the fundamental frequency of a YAG laser of wavelength about 1.06 μm. The resistances between the adjacent $SnO_2$ layers were each found to be not less than 1 Mohm. Following this, ultrasonic cleaning in pure water was carried out, resulting in the scribed conductive tempered glass shown in FIG. 3.

Figure 4:
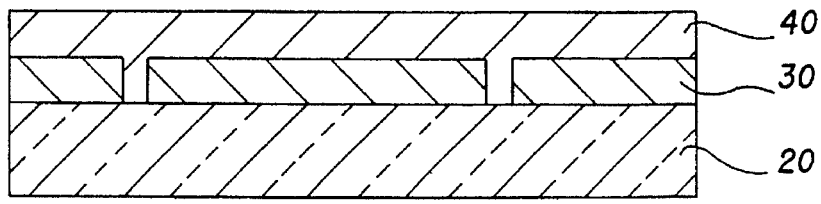
Figure 5:
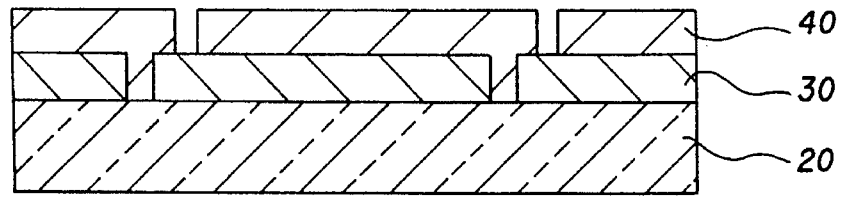
Figure 6:
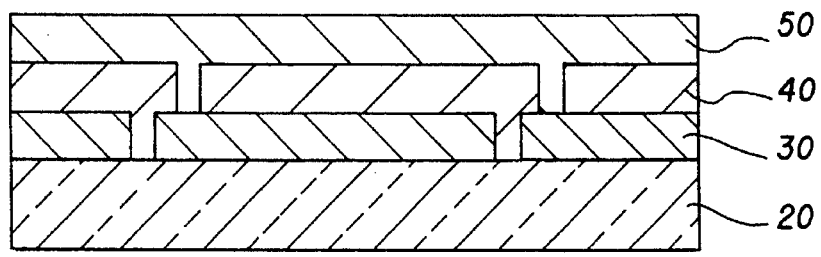

As illustrated in FIG. 4, a semiconductor layer 40 was fabricated over the scribed $SnO_2$ layer, by forming layers of p-type amorphous silicon semiconductor, i-type amorphous silicon semiconductor, and n-type microcrystalline silicon semiconductor of thickness 15 nm, 450 nm, and 300 nm, respectively. These layers were fabricated in a capacitatively coupled glow discharge decomposition apparatus by decomposition of a gas mixture of $SiH_4$, $CH_4$, and $B_2H_6$, a gas mixture of $SiH_4$ and $H_2$, and a gas mixture of $SiH_4$, $PH_3$, and $H_2$, in order, at a substrate temperature of 200° C. and pressure of 0.5–1.0 Torr. After cooling, the amorphous semiconductor layer 40 was divided at positions offset by 50 μm from the scribed parts of the $SnO_2$ layer, by utilizing a YAG laser, using its second harmonic to prevent damage to the $SnO_2$ layer 30 (see FIG. 5). Thereafter, for the back metal electrode 50, a thin aluminum film of thickness 250 nm was fabricated under vacuum at room temperature using an electron beam vapor deposition apparatus (see FIG. 6). After the glass substrate 20 was removed from the vapor deposition apparatus, the back metal electrode 50 was scribed at positions offset by 50 μm from the scribed part of the amorphous semiconductor layer 40 by a YAG laser, using its second harmonic to prevent damage to the amorphous semiconductor layer 40, to form an integrated solar module, as shown in FIG. 7. The dividing gaps formed by the laser scribing were about 50 μm, 150 μm, and 150 μm for the SnO$_2$ layer 30, the amorphous semiconductor layer 40 and the back metal electrode 50, respectively. The obtained solar cell gave an output power of about 15 Watts under illumination of 100 mW/cm$^2$ AM-1.5 simulated sunlight.

Figure 9:
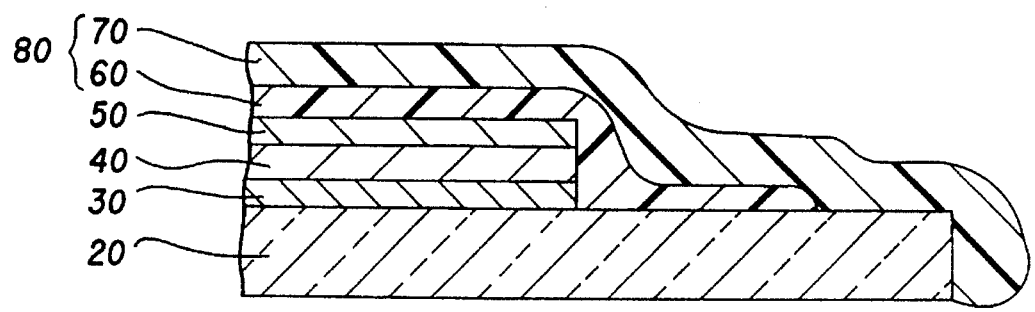
FIG. 9 is a schematic illustration showing the edge structure of an alternative example of the solar module of the present invention.

A solution of a copolymer of ethylene and vinyl alcohol (for example, EVAL (Trade Name, made by Kuraray Co. Ltd.)) in dimethylsulfoxide solvent was coated onto the surface of the back metal electrode 50 of this solar module, so as to give a thickness after drying of about 20 μm, then stood at 130° C. for about 30 min, and cured by evaporating off the solvent, to form an oxygen barrier layer 60. After cooling, a water vapor barrier layer 70 having polyisobutylene as the main constituent was formed by coating followed by thermal curing at 130° C. for about 1 hr. Here, the edge of the glass was covered by the passivating resin 80 in order to prevent the infusion of water at the edge face. This structure is shown in FIGS. 8 and 9. The polyisobutylene resin layer 70 was fabricated by using the following composition: 100 parts by weight of polyisobutylene oligomer, 100 parts by weight of polybutene, 9 parts by weight of DD4H, 120 parts by weight of SiO$_2$, 5 parts by weight of TiO$_2$, 5 parts by weight of carbon, and 1 part by weight of an anti-aging agent. The polyisobutylene resin had a molecular weight of about 5,000 and was prepared according to Example 11 of Japanese Unexamined Patent Publication (Tokkyo Kokai) No. 3-152164. DD4H is 1,3,5,7-tetramethyl-1-{10-(1,3,5,7-tetramethylcyclotetracyloxanyl)-1-decyl}-cyclotetracyloxane, as described in Example 11 of Japanese Unexamined Patent Publication (Tokkyo Kokai)No. 3-95266.

At the positions for electrical contacting, the resin was removed, electrical lead lines were connected by soldering, and the parts where the resin had been removed were then coated again with the above-described polyisobutylene composition and cured at 130° C. After cooling, the solar module was completed by covering the edge face of the passivating resin layer 80—coated glass substrate 20 with an aluminum frame. A solar module fabricated in this way, having the structure shown in FIG. 9, gave an output power of 15 Watts under 100 mW/cm$^2$ AM-1.5 simulated sunlight.

EXAMPLE 2

A solar module was prepared in the same manner as Example 1, except that the glass substrate 20 had a size of 300 mm by 400 mm and a thickness of 3 mm. In order to evaluate the reliability of this module, the time-dependence of the module properties was studied under pressure cooker testing (test conditions: chamber temperature 127° C. relative humidity 80% RH, chamber pressure 2 atmospheres). Values of maximum output power measured during the test are shown normalized to the initial value in Table 1.

EXAMPLE 3

On the back metal electrode surface 50 of a solar cell element fabricated on a 3 mm thick, 300 mm by 400 mm glass substrate 20 in a manner similar to Example 1, a polyisobutylene resin layer, prepared as in Example 1, was coated directly and thermally cured at 130° C. for about 1 hr, to form a water vapor barrier layer 70. At the positions for electrical contact, the resin was removed, the electrical lead lines were connected by soldering, and the parts where the resin had been removed were again potted with polyisobutylene composition as in Example 1 and thermally cured at 130° C. for 1 hr. After cooling, the edge face of the module was covered by an aluminum frame containing a thermoplastic butylene rubber, to complete the solar module. The time-dependence of the properties of this solar module was then investigated by carrying out a pressure cooker test under the same conditions as Example 2. The results are also shown in Table 1.

Comparative Example 1

Figure 10:
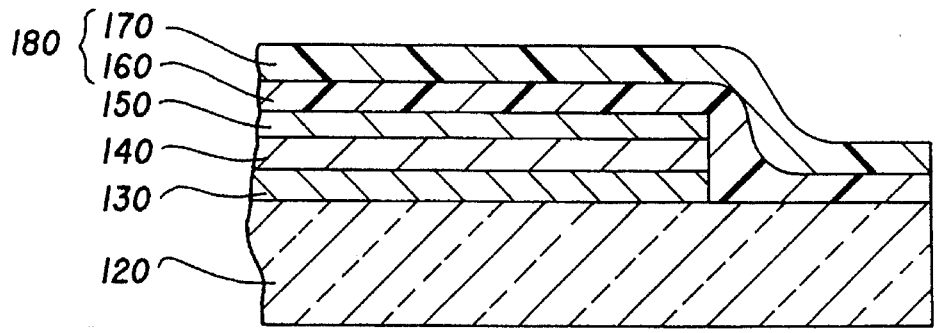
FIG. 10 is a schematic illustration of the edge structure of a previous solar module type, as described in the Comparative Example 1.

A solar module was fabricated on a 3 mm thick, 300 mm by 400 mm glass substrate 120 using a conventional vacuum laminating method. The structure, shown in FIG. 10, comprised a glass substrate 120, a transparent conductive film 130, a semiconductor layer 140, a back metal electrode 150, and a passivating resin layer 180, comprising an ethylenevinyl acetate copolymer resin film 160 and a film of aluminum foil covered by a layer of polyvinyl fluoride (PVF) resin 170. This passivating resin layer 180 was fabricated as follows. An adhesive layer of ethylene-vinyl acetate copolymer resin film 160 of thickness 600 μm was cut a little larger than the glass substrate 120, and positioned to cover the substrate 120. Thereon, a film of aluminum foil covered by a layer of polyvinyl fluoride resin (PVF 38 μm/Al foil 30 μm/PVF 38 μm) 170 was similarly cut a little larger than the substrate 120, positioned on the substrate 120 and thermocompression-bonded using a vacuum laminating method. The time-dependence of the properties of this solar module was then investigated by carrying out a pressure cooker test under the same conditions as Example 2. The results are also shown in Table 1.

Comparative Example 2

A solar module was fabricated in a similar manner to Comparative Example 1, except that a 100 μm thick polyethylene film was used in place of the aluminum foil-polyvinyl fluoride resin composite film 170 of Comparative Example 1 in fabricating the passivating resin layer 180. The water vapor permeability of the polyethylene layer was 2–3 g/m$^2$ day. The time-dependence of the properties of this solar module was then investigated by carrying out a pressure cooker test under the same conditions as Example 2. The results are also shown in Table 1.

Comparative Example 3

A solar module was fabricated in a similar manner to Comparative Example 1, except that a 100 μm thick polypropylene film having a water vapor permeability of about 1.5 g/m$^2$ day was used in place of the aluminum foil-polyvinyl fluoride resin composite film 170 of Comparative Example 1 in fabricating the passivating resin layer 180. The time-dependence of the properties of this solar module was then investigated by carrying out a pressure cooker test under the same conditions as Example 2. The results are also shown in Table 1.

TABLE 1

| | Normalized Maximum Output Power | | | | |
| --- | --- | --- | --- | --- | --- |
| | Initial | 30 hr | 100 hr | 300 hr | 500 hr |
| Example 2 | 1.0 | 1.02 | 1.01 | 1.0 | 0.99 |
| Example 3 | 1.0 | 1.04 | 1.03 | 1.01 | 1.02 |
| Comp. Ex. 1 | 1.0 | 1.01 | 0.98 | 0.95 | 0.67 |
| Comp. Ex. 2 | 1.0 | 0.20 | 0.0 | 0.0 | 0.0 |
| Comp. Ex. 3 | 1.0 | 0.15 | 0.0 | 0.0 | 0.0 |

From Table 1, it can be seen that, in contrast to the Comparative Examples 1–3, the solar modules of the present invention show almost no degradation of the solar cell maximum output power after a pressure cooker test of 500 hr, which is a stringent test for electrical components.

As explained above, the solar module of the present invention has, in spite of its large area, excellent resistance to water vapor and oxygen. Therefore, since almost no degradation of performance occurs even after long periods of outdoor use, the solar modules have excellent reliability.

It is further understood by those skilled in the art that the foregoing description are preferred embodiments of the disclosed device and that various changes and modifications may be made in the invention without departing from the spirit and scope thereof.

What is claimed is:

1. A solar module comprising a glass substrate having formed thereon, in order,
   (a) a conductive metal oxide layer;
   (b) an amorphous semiconductor layer;
   (c) a back metal electrode; and
   (d) a passivating resin layer,
   wherein the passivating resin layer comprises a hydrocarbon-based water vapor barrier layer having a permeability to water vapor of not more than 1 g/m$^2$ day measured at a thickness of 100 μm, and wherein said water vapor barrier layer comprises a polymer selected from the group consisting of polyisobutylene, polyisoprene, modified polyisoprene, polybutene, polybutadiene, and modified polybutadiene.

2. The solar module of claim 1 wherein at least one part of the passivating resin layer is formed by coating.

3. The solar module of claim 1 wherein at least one part of the passivating resin layer is formed by coating followed by thermal curing.

4. The solar module of claim 1 wherein the passivating resin layer also comprises an oxygen barrier layer having a permeability to oxygen of not more than 0.1 cc mm/m$^2$ day atm.

5. The solar module of claim 4 wherein the oxygen barrier layer is comprised of a copolymer of ethylene and vinyl alcohol.

6. The solar module of claim 1, wherein the active area of the solar module is not less than 0.1 m$^2$.

7. A solar module comprising a glass substrate having formed thereon, in order,
   (a) a conductive metal oxide layer;
   (b) an amorphous semiconductor layer;
   (c) a back metal electrode; and
   (d) a passivating resin layer,
   wherein the passivating resin layer comprises a hydrocarbon-based water vapor barrier layer having a permeability to water vapor of not more than 1 g/m$^2$ day measured at a thickness of 100 μm and wherein the water vapor barrier layer comprises a polyisobutylene resin.

* * * * *